United States Patent
Chiang et al.

(10) Patent No.: US 12,236,976 B2
(45) Date of Patent: *Feb. 25, 2025

(54) VOICE ACTIVITY DETECTION SYSTEM AND ACOUSTIC FEATURE EXTRACTION CIRCUIT THEREOF

(71) Applicants: NCKU Research and Development Foundation, Tainan (TW); Himax Technologies Limited, Tainan (TW)

(72) Inventors: Meng-Ju Chiang, Tainan (TW); Soon-Jyh Chang, Tainan (TW)

(73) Assignees: NCKU Research and Development Foundation, Tainan (TW); Himax Technologies Limited, Tainan (TW)

( * ) Notice: Subject to any disclaimer, the term of this patent is extended or adjusted under 35 U.S.C. 154(b) by 0 days.

This patent is subject to a terminal disclaimer.

(21) Appl. No.: 18/653,676

(22) Filed: May 2, 2024

(65) Prior Publication Data
US 2024/0282332 A1    Aug. 22, 2024

Related U.S. Application Data

(62) Division of application No. 17/411,735, filed on Aug. 25, 2021, now Pat. No. 12,020,725.

(51) Int. Cl.
*H03F 3/45*    (2006.01)
*G10L 15/02*   (2006.01)
*G10L 25/84*   (2013.01)

(52) U.S. Cl.
CPC .............. *G10L 25/84* (2013.01); *G10L 15/02* (2013.01); *H03F 3/45475* (2013.01)

(58) Field of Classification Search
CPC ........................................................ H03F 3/45
(Continued)

(56) References Cited

U.S. PATENT DOCUMENTS 7,914,468 B2 * 3/2011 Shalon ................. A61B 5/0006
                                                      600/595
2006/0064037 A1 * 3/2006 Shalon ................... G16H 20/60
                                                      128/903

(Continued)

OTHER PUBLICATIONS

Badami, Komail M.H. et al., "A 90 nm CMOS, 6 μW Power-Proportional Acoustic Sensing Frontend for Voice Activity Detection", IEEE Journal of Solid State Circuits, vol. 51, No. 1, Jan. 2016.

(Continued)

*Primary Examiner* — Henry Choe
(74) *Attorney, Agent, or Firm* — Donald E. Stout; Stout, Uxa & Buyan, LLP

(57) ABSTRACT

An acoustic feature extraction (AFE) circuit includes a plurality of band-pass filters (BPFs) adaptable to a plurality of channels with different band-pass frequency ranges respectively for switchably receiving an amplified signal, thereby generating corresponding filtered signals, the plurality of BPFs including an operational amplifier that is shared among the plurality of channels; and a rectifier switchably coupled to receive the filtered signals, thereby generating a rectified signal. The amplified signal is time-division demultiplexed onto the BPFs in different phases, and the filtered signals are time-division multiplexed onto the rectifier in different phases.

5 Claims, 7 Drawing Sheets

(58) Field of Classification Search
USPC .................................................. 330/252, 306
See application file for complete search history.

(56) References Cited

U.S. PATENT DOCUMENTS

2011/0125063 A1    5/2011  Shalon et al.
2023/0300529 A1*   9/2023  Zhang ................. G10L 21/0208
                                                          381/94.1

OTHER PUBLICATIONS

Shi, Erjia et al., "A 270 nW Switched-Capacitor Acoustic Feature Extractor for Always-On Voice Activity Detection", IEEE Transactions on Circuits and Systems—1. Regular Papers, Nov. 2020.

* cited by examiner

Phase 1 (Φ1)

Phase 1 (Φ2)

Phase 2 (Φ3)

| | Φ1 | Φ2 | Φ3 | Φ4 | Φ5 | Φ6 |
|---|---|---|---|---|---|---|
| channel 1 | charge | filter | rectifier | hold | hold | hold |
| channel 2 | hold | hold | charge | filter | rectifier | hold |
| channel 3 | rectifier | hold | hold | hold | charge | filter |

VOICE ACTIVITY DETECTION SYSTEM AND ACOUSTIC FEATURE EXTRACTION CIRCUIT THEREOF

CROSS-REFERENCE TO RELATED APPLICATIONS

This application is a divisional application of U.S. application Ser. No. 17/411,735, filed on Aug. 25, 2021, the entire contents of which are herein expressly incorporated by reference.

BACKGROUND OF THE INVENTION

1. Field of the Invention

The present invention generally relates to voice activity detection (VAD), and more particularly to an acoustic feature extraction (AFE) circuit thereof.

2. Description of Related Art

Voice activity detection (VAD) is a technology capable of detecting or recognizing presence or absence of human speech. VAD can be used to activate speech-based applications such as Apple Inc.'s virtual assistant Siri. VAD may be commonly adopted as a front-end device, which is generally an always-on and low-power system.

VAD has been conventionally implemented by digital architecture, which, however, requires considerable circuit area and consumes substantive power. Moreover, conventional VAD suffers process-voltage-temperature (PVT) variation.

A need has thus arisen to propose a novel VAD system to overcome drawbacks of conventional VAD systems.

SUMMARY OF THE INVENTION

In view of the foregoing, it is an object of the embodiment of the present invention to provide a voice activity detection (VAD) system with an acoustic feature extraction (AFE) circuit capable of substantially reducing power consumption with high performance.

According to one embodiment, an acoustic feature extraction (AFE) circuit includes a plurality of band-pass filters (BPFs) and a rectifier. The band-pass filters (BPFs) are adaptable to a plurality of channels with different band-pass frequency ranges respectively for switchably receiving an amplified signal, thereby generating corresponding filtered signals, an operational amplifier being shared among the plurality of channels. The rectifier is switchably coupled to receive the filtered signals, thereby generating a rectified signal. The amplified signal is time-division demultiplexed onto the BPFs in different phases, and the filtered signals are time-division multiplexed onto the rectifier in different phases.

DETAILED DESCRIPTION OF THE INVENTION

Figure 1:
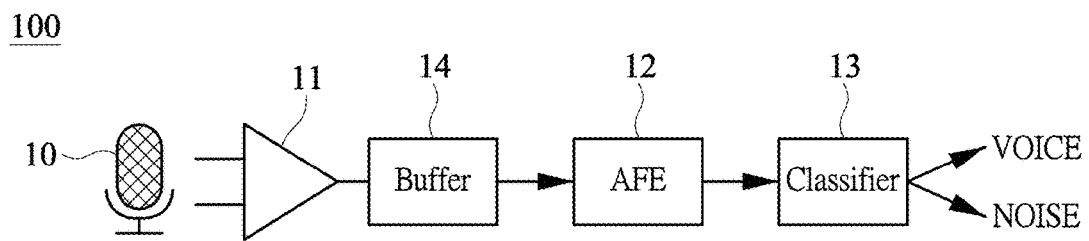
FIG. 1 shows a block diagram illustrating a voice activity detection (VAD) system according to one embodiment of the present invention.

FIG. 1 shows a block diagram illustrating a voice activity detection (VAD) system 100 according to one embodiment of the present invention. In the embodiment, the VAD system 100 may be an analog system that operates on analog signals.

The VAD system 100 of the embodiment may include an amplifier 11 coupled to receive a sound signal converted from sound by a converter such as a microphone 10, and configured to generate an amplified signal according to the sound signal. In the embodiment, the amplifier 11 may be a low-noise amplifier (LNA) capable of amplifying a low-power signal (e.g., the sound signal) without substantially degrading a signal-to-noise ratio (SNR).

The VAD system 100 of the embodiment may include an acoustic feature extraction (AFE) circuit 12 coupled to receive the amplified signal, and configured to generate a feature signal representing a feature extracted from the amplified signal.

The VAD system 100 of the embodiment may include a classifier 13 configured to identify the feature signal as a voice or a noise. In one embodiment, the classifier 13 may include an (analog) neural network circuit.

In one embodiment, the VAD system 100 may further include a buffer 14, such as a unit-gain buffer, disposed between the amplifier 11 and the AFE circuit 12, and configured to provide electrical impedance transformation from the amplifier 11 to the AFE circuit 12, such that the amplified signal may not be affected by the AFE circuit 12 (i.e., the load).

Figure 2:
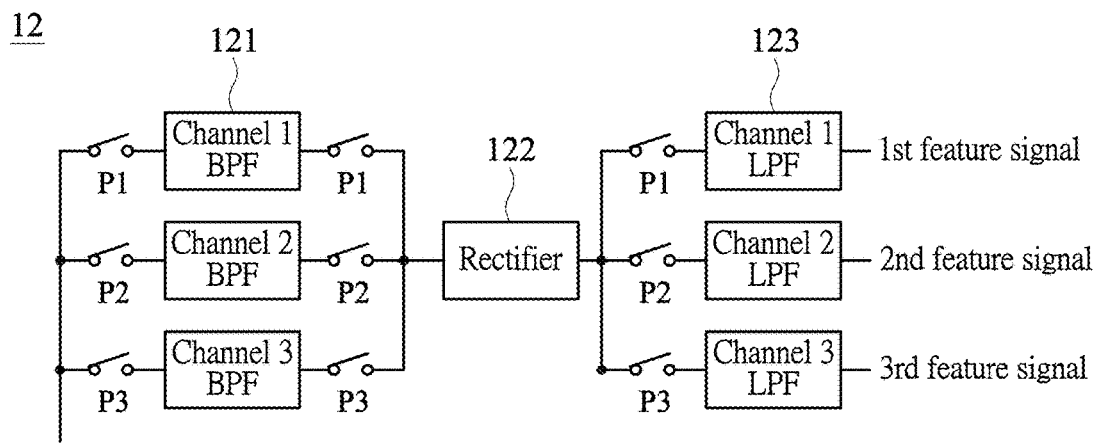
FIG. 2 shows a detailed block diagram illustrating the acoustic feature extraction (AFE) circuit of FIG. 1.

FIG. 2 shows a detailed block diagram illustrating the acoustic feature extraction (AFE) circuit 12 of FIG. 1. In the embodiment, the AFE circuit 12 may include a plurality of band-pass filters (BPFs) 121 adaptable to a plurality of channels (three channels are exemplified here) with different band-pass frequency ranges respectively (e.g., 95-195 Hz, 150-310 Hz and 250-500 Hz), thereby generating corresponding filtered signals. Specifically, the band-pass filters 121 are switchably coupled to receive the amplified signal (from the amplifier 11). According to one aspect of the embodiment, the amplified signal is time-division demultiplexed onto the BPFs 121 in different phases (e.g., phase 1 through phase 3 via phase switches P1-P3 respectively).

The AFE circuit 12 of the embodiment may include a rectifier 122 switchably coupled to receive the filtered signals, which are time-division multiplexed onto the rectifier 122 in different phases (e.g., via phase switches P1-P3 respectively), thereby generating a rectified signal. Therefore, a single rectifier 122 is needed for all the channels.

The AFE circuit 12 of the embodiment may include a plurality of low-pass filters (LPFs) 123 adaptable to the plurality of channels with the same low-pass frequency range (e.g., having a cut-off frequency of 30 Hz), thereby generating corresponding feature signals (e.g., 1st feature signal through 3rd feature signal as exemplified in FIG. 2). Specifically, the low-pass filters 123 are switchably coupled to receive the rectified signal (from the rectifier 122). The rectified signal is time-division demultiplexed onto the LPFs 123 in different phases (e.g., phase 1 through phase 3 via phase switches P1-P3 respectively).

Figure 3A:
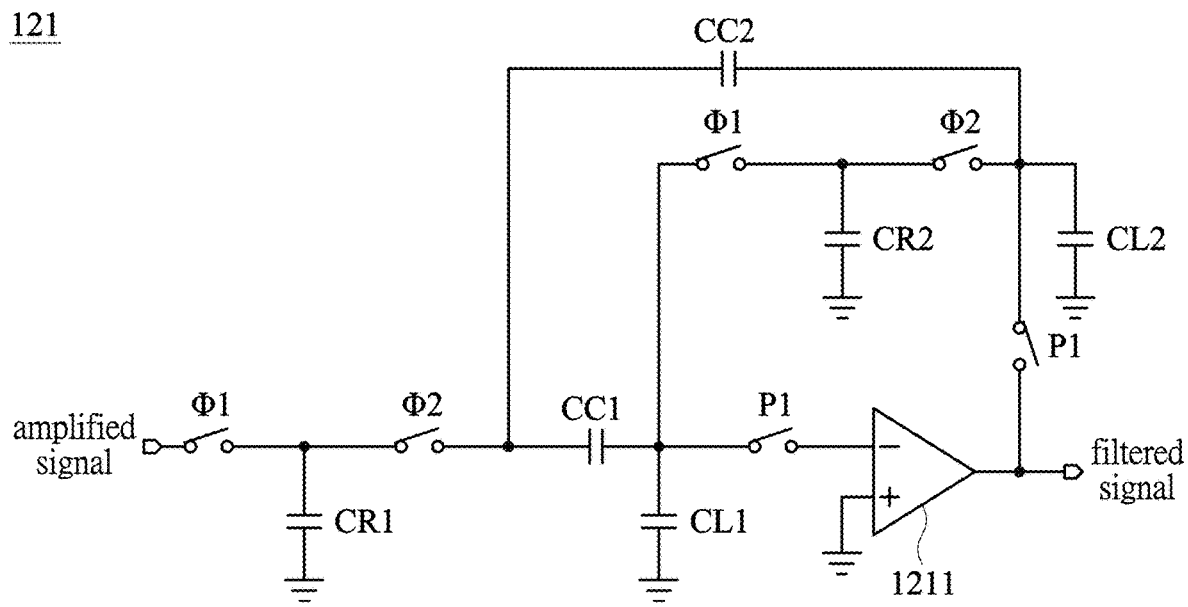
FIG. 3A shows a circuit diagram illustrating a BPF of FIG. 2 for one channel.
Figure 3B:
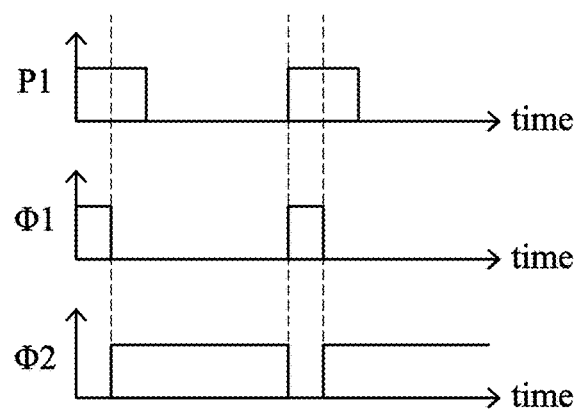
FIG. 3B shows a timing diagram illustrating time periods of corresponding phase.

FIG. 3A shows a circuit diagram illustrating a BPF 121 of FIG. 2 for one channel (e.g., channel 1), and FIG. 3B shows a timing diagram illustrating time periods of corresponding phase. In the embodiment, each phase is divided into a first period (e.g., Φ 1) and a second period (e.g., Φ2). For example, the first period Φ 1 lies in the first half of the phase signal P1, and the second period Φ 2 follows the first period first period Φ 1 until the beginning of the next phase signal P1.

In the embodiment, the BPF 121 may include a switched-capacitor (SC) circuit. Specifically, the BPF 121 may include an operational amplifier 1211 with a negative input node, a positive input node (connected to earth) and an output node. According to one aspect of the embodiment, a single operational amplifier 1211 may be shared among the channels in a time-division demultiplexing manner, thereby substantially reducing power consumption and circuit area.

The BPF 121 may include a first charge capacitor CR1 with a first end switchably coupled to receive the amplified signal via a first period switch Φ 1 that is closed in the first period, and with a second end connected to earth. The BPF 121 may include a first filter capacitor CC1 with a first end switchably connected to (the first end of) the first charge capacitor CR1 via a second period switch Φ2 that is closed in the second period, and with a second end switchably connected to the negative input node (of the operational amplifier 1211) via a phase switch P1 that is closed in a corresponding phase. The BPF 121 may include a second filter capacitor CC2 with a first end connected to (the first end of) the first filter capacitor CC1, and with a second end switchably connected to the output node of the operational amplifier 1211 via another phase switch P1. The BPF 121 may include a second charge capacitor CR2 with a first end switchably connected to the second end of the first filter capacitor CC1 via another first period switch Φ 1 and switchably connected to the second end of the second filter capacitor CC2 via another second period switch Φ2, and with a second end connected to earth.

According to another aspect of the embodiment, the BPF 121 may include a first stabilizing capacitor CL1 with a first end switchably connected to the negative input node of the operational amplifier 1211 via the phase switch P1, and with a second end connected to earth. The first stabilizing capacitor CL1 is configured to solve floating voltage issue at the interconnect node between the first filter capacitor CC1 and the first stabilizing capacitor CL1 in hold state. The BPF 121 may further include a second stabilizing capacitor CL2 with a first end switchably connected to the output node of the operational amplifier 1211 via said another phase switch P1, and with a second end connected to earth. The second stabilizing capacitor CL2 is configured to stabilize the voltage at the output node of the operational amplifier 1211 in charge state.

Figure 4A:
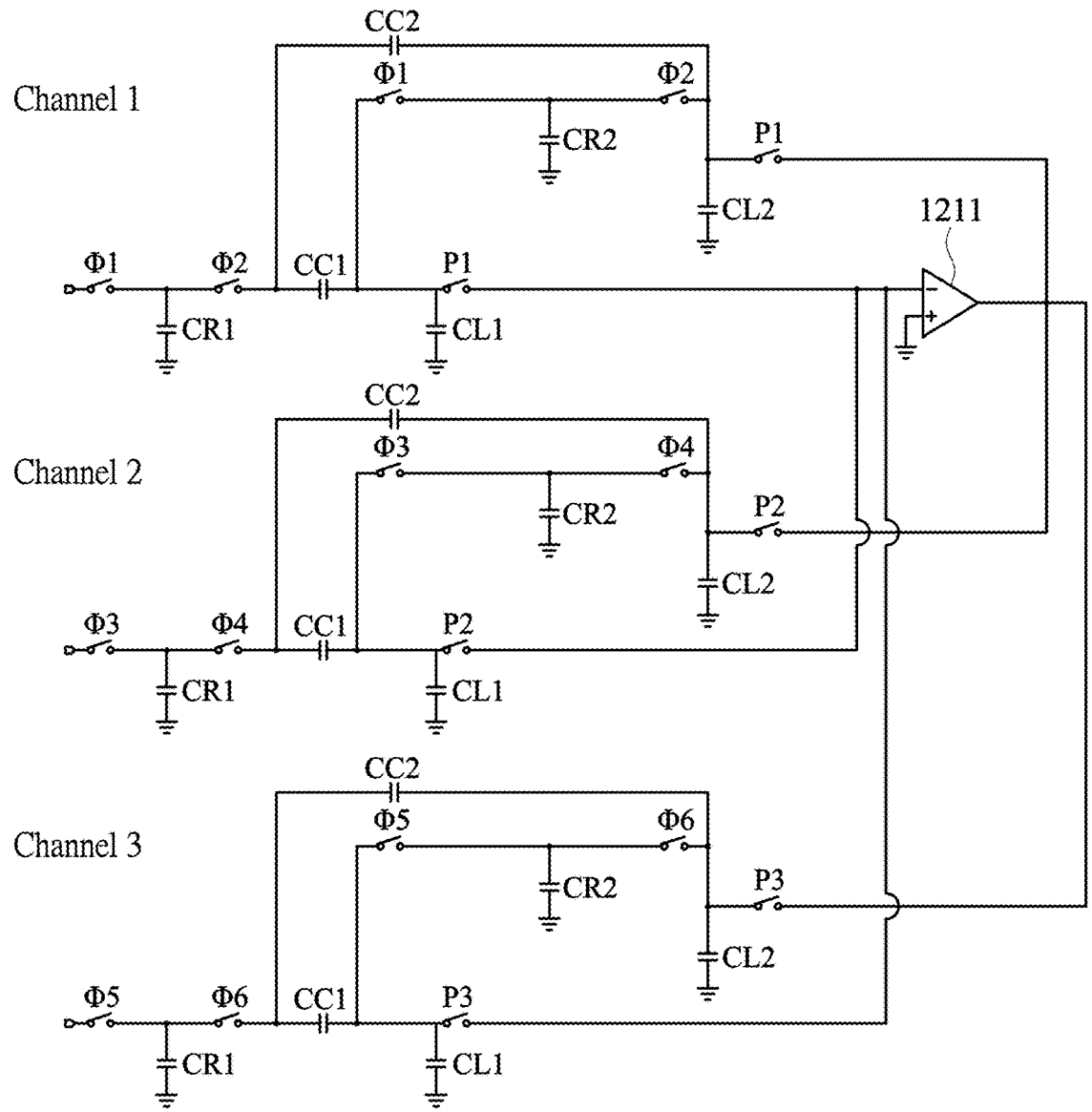
FIG. 4A shows a circuit diagram illustrating BPFs for three channels.
Figure 4B:
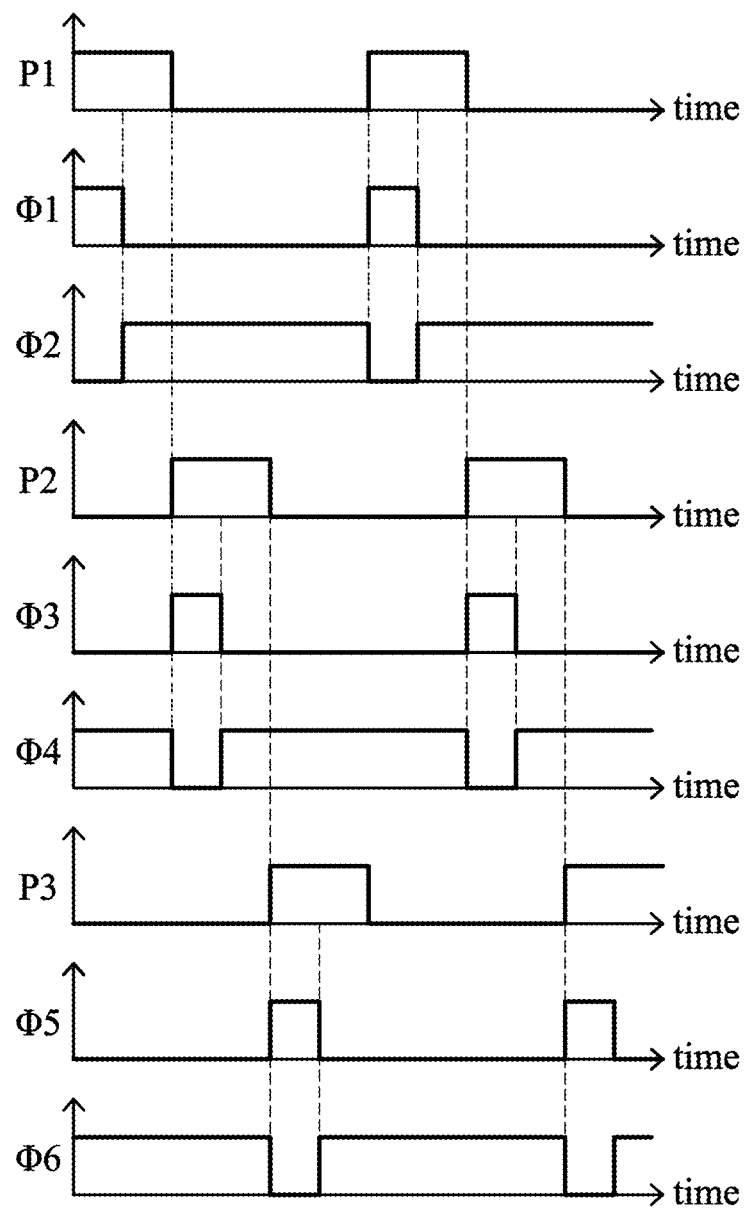
FIG. 4B shows a timing diagram illustrating time periods of corresponding phases.

FIG. 4A shows a circuit diagram illustrating BPFs 121 for three channels, and FIG. 4B shows a timing diagram illustrating time periods of corresponding phases. It is noted that a single operational amplifier 1211 may be shared among the channels in a time-division demultiplexing manner.

Figure 5A:
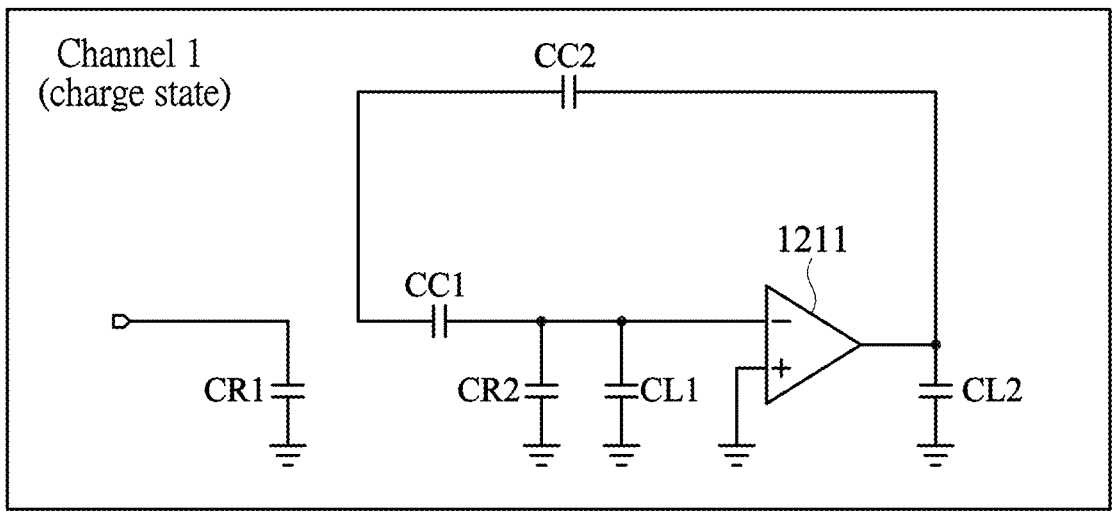
FIG. 5A shows equivalent circuits of the BPFs in the first period $\Phi 1$ of the first phase P1.
Figure 5A:
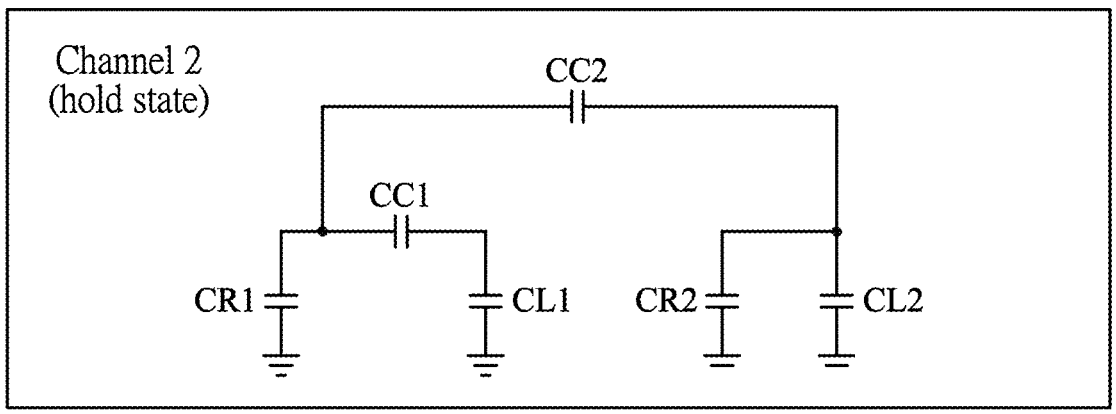
Figure 5A:
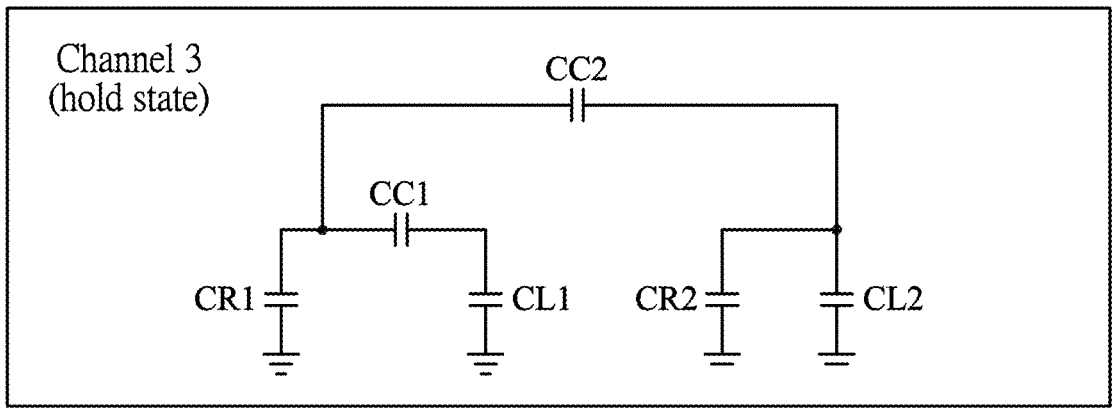
Figure 5B:
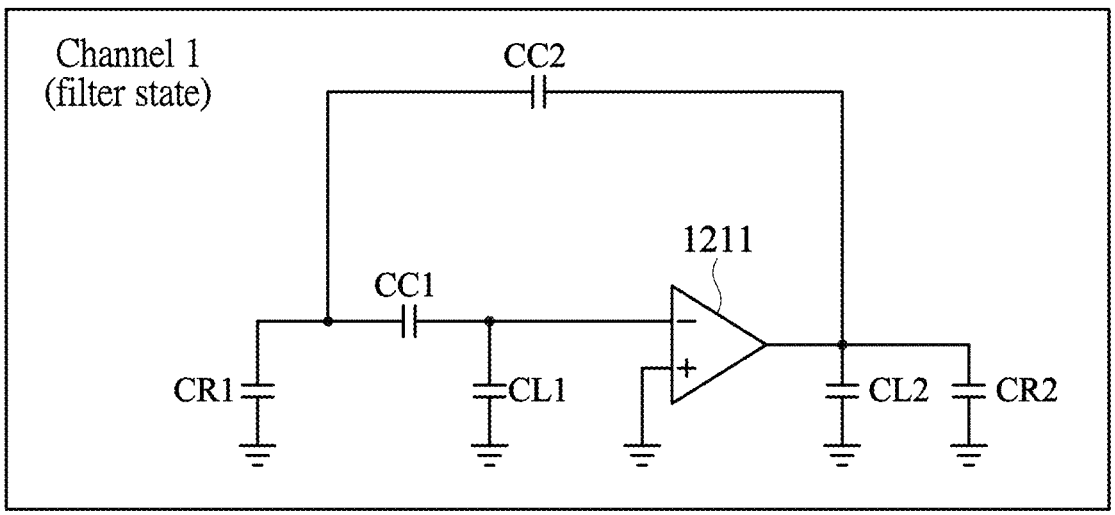
FIG. 5B shows equivalent circuits of the BPFs in the second period $\Phi 2$ of the first phase P1.
Figure 5B:
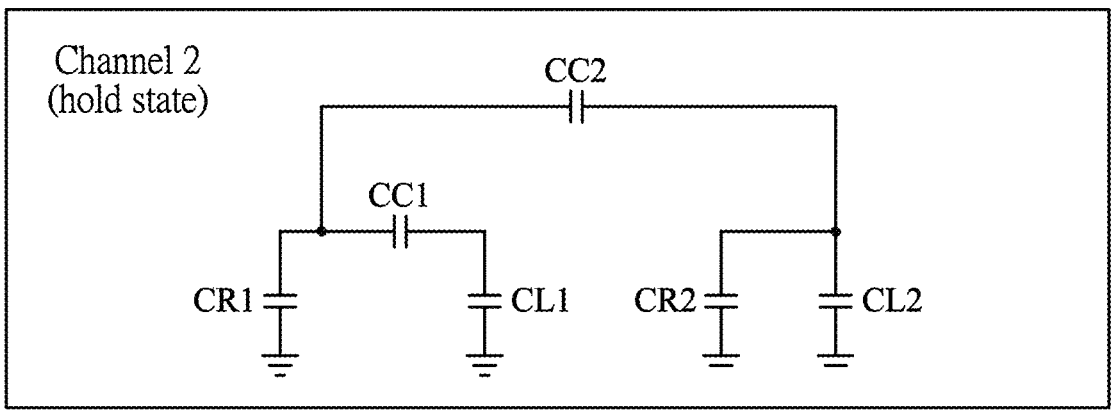
Figure 5B:
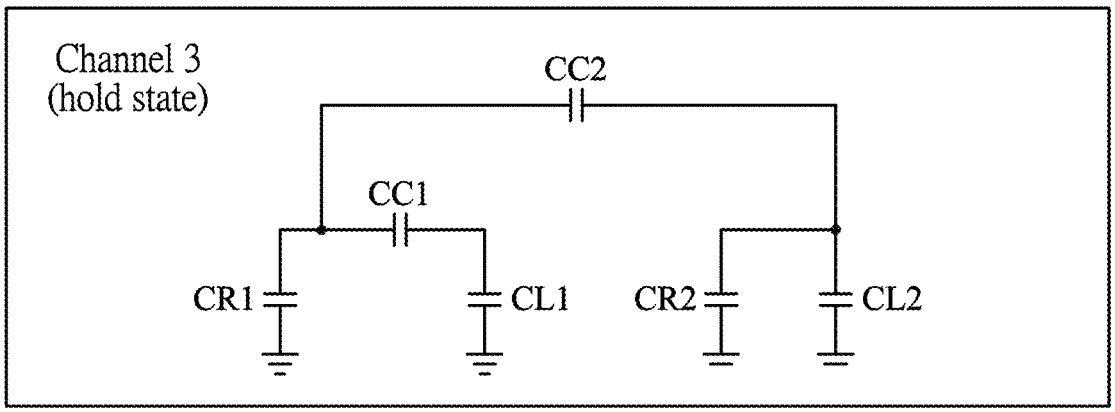
Figures 5C, 5D:
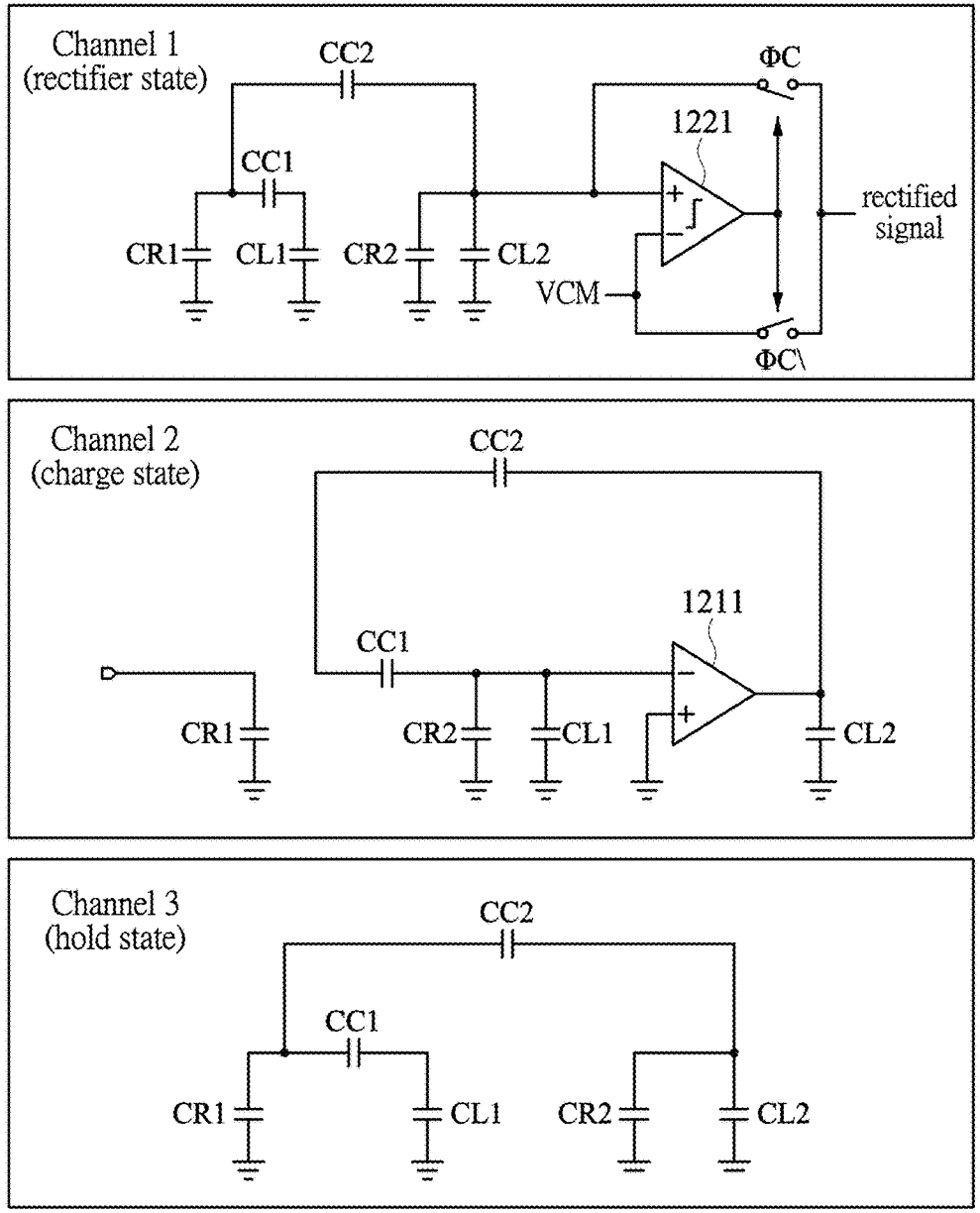
FIG. 5C shows equivalent circuits of the BPFs in the first period $\Phi 3$ of the second phase P2.
FIG. 5D shows a table illustrating states of the BPFs in corresponding periods and phases.

FIG. 5A shows equivalent circuits of the BPFs 121 in the first period Φ 1 of the first phase P1, in which the BPF 121 of channel 1 is in charge state, the BPF 121 of channel 2 is in hold state, and the BPF 121 of channel 3 is in hold state. FIG. 5B shows equivalent circuits of the BPFs 121 in the second period Φ 2 of the first phase P1, in which the BPF 121 of channel 1 is in filter state, the BPF 121 of channel 2 is in hold state, and the BPF 121 of channel 3 is in hold state. FIG. 5C shows equivalent circuits of the BPFs 121 in the first period Φ3 of the second phase P2, in which the BPF 121 of channel 1 is in rectifier state, the BPF 121 of channel 2 is in charge state, and the BPF 121 of channel 3 is in hold state. FIG. 5D shows a table illustrating states of the BPFs 121 in corresponding periods and phases. It is noted that the operational amplifier 1211 is utilized in charge and filter states, while the rectifier 122 is utilized in rectifier state.

Figure 6:
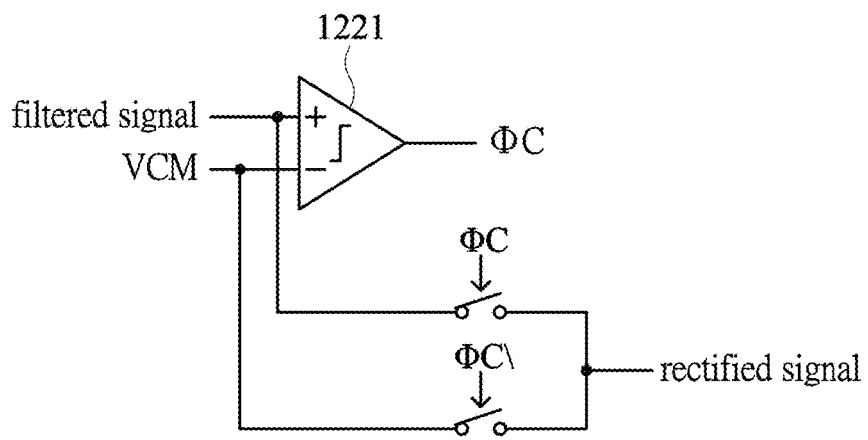
FIG. 6 shows a circuit diagram illustrating the rectifier of FIG. 2.

FIG. 6 shows a circuit diagram illustrating the rectifier 122 of FIG. 2. In the embodiment, the rectifier 122 may include an operational amplifier 1221 with a positive input node coupled to receive the filtered signal, and with a negative input node coupled to receive a common-mode voltage VCM, thereby generating a switch signal Φ C. The filtered signal is switchably transferred via a first switch that is controlled by the switch signal Φ C, and the common-mode voltage VCM is switchably transferred via a second switch that is controlled by an inverted switch signal ΦC\. Accordingly, one of the filtered signal and the common-mode voltage VCM is transferred as the rectified signal, thereby resulting in a half-wave rectifier. In an alternative embodiment, the rectifier 122 may be implemented by a full-wave rectifier instead.

Figure 7:
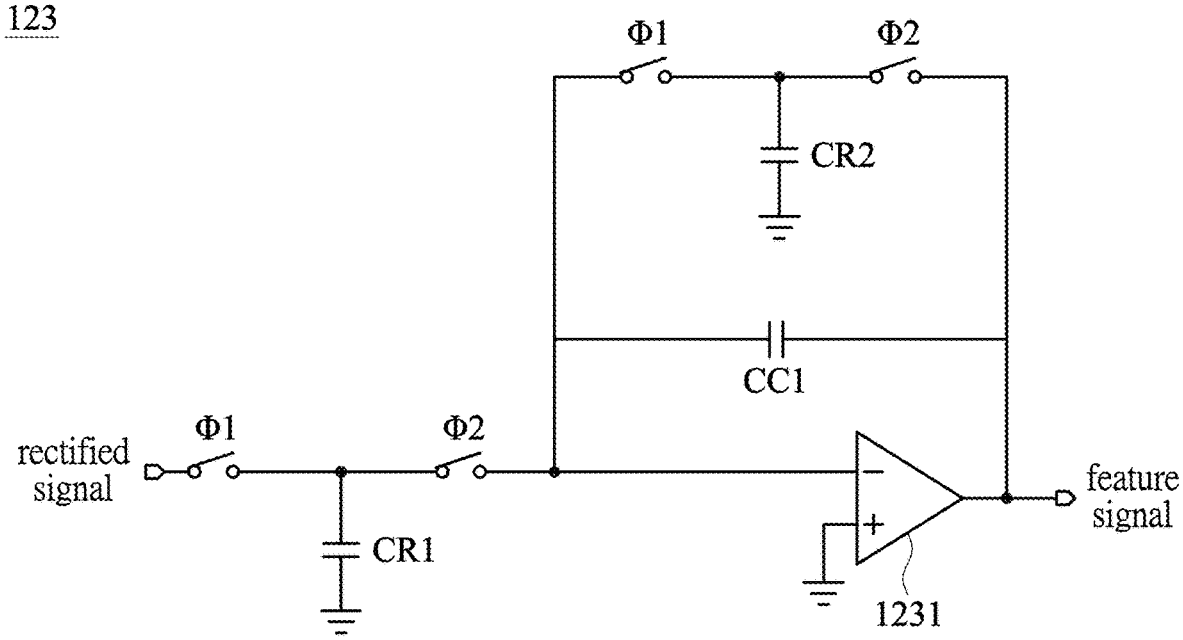
FIG. 7 shows a circuit diagram illustrating a LPF for one channel.

FIG. 7 shows a circuit diagram illustrating a LPF 123 for one channel. In the embodiment, the LPF 123 may include a switched-capacitor (SC) circuit. Specifically, the LPF 123 may include an operational amplifier 1231 with a negative input node, a positive input node (connected to earth) and an output node. The operational amplifier 1231 may act as a buffer or driving stage, and may be omitted when buffering or driving is not required. The LPF 123 may include a first charge capacitor CR1 with a first end switchably coupled to receive the rectified signal via a first period switch Φ 1 that is closed in the first period, and with a second end connected to earth. The LPF 123 may include a filter capacitor CC1 with a first end switchably connected to (the first end of) the first charge capacitor CR1 via a second period switch Φ2 that is closed in the second period, and with a second end connected to the output node (of the operational amplifier 1231). The BPF 121 may include a second charge capacitor CR2 with a first end switchably connected to the negative input node of the operational amplifier 1231 via another first period switch Φ 1 and switchably connected to the second end of the filter capacitor CC1 via another second period switch Φ2, and with a second end connected to earth.

Although specific embodiments have been illustrated and described, it will be appreciated by those skilled in the art that various modifications may be made without departing from the scope of the present invention, which is intended to be limited solely by the appended claims.

What is claimed is:

1. A voice activity detection (VAD) system, comprising:
   an amplifier coupled to receive a sound signal, according to which an amplified signal is generated;

an acoustic feature extraction (AFE) circuit coupled to receive the amplified signal, and configured to generate a feature signal representing a feature extracted from the amplified signal;

a classifier configured to identify the feature signal as a voice or a noise;

wherein the AFE circuit comprises a single operational amplifier that is shared among a plurality of channels;

a plurality of band pass filters (BPFs) adaptable to the plurality of channels with different band-pass frequency ranges respectively for switchably receiving the amplified signal, thereby generating corresponding filtered signals; and a rectifier switchably coupled to receive the filtered signals, thereby generating a rectified signal; wherein the amplified signal is time-division demultiplexed onto the BPFs in different phases, and the filtered signals are time-division multiplexed onto the rectifier in different phases.

2. The VAD system of claim 1, further comprising:
a buffer disposed between the amplifier and the AFE circuit, and configured to provide electrical impedance transformation from the amplifier to the AFE circuit.

3. The VAD system of claim 1, wherein each BPF comprises:

said operational amplifier that is shared among the plurality of channels; and a first stabilizing capacitor with a first end switchably connected to a negative input node of the operational amplifier via a phase switch that is closed in corresponding phase, and with a second end connected to earth;

wherein each phase is divided into a first period and a second period.

4. The VAD system of claim 3, wherein each BPF further comprises:

a second stabilizing capacitor with a first end switchably connected to an output node of the operational amplifier via another phase switch that is closed in corresponding phase, and with a second end connected to earth.

5. The VAD system of claim 1, wherein the AFE circuit further comprises:

a plurality of low-pass filters (LPFs) adaptable to the plurality of channels with a same low-pass frequency range for switchably receiving the rectified signal, thereby generating corresponding feature signals.

* * * * *